United States Patent
Sugawara

(10) Patent No.: US 8,247,794 B2
(45) Date of Patent: Aug. 21, 2012

(54) NITRIDE SEMICONDUCTOR DEVICE

(75) Inventor: Hideto Sugawara, Fukuoaka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 142 days.

(21) Appl. No.: 12/952,758

(22) Filed: Nov. 23, 2010

(65) Prior Publication Data

US 2011/0309329 A1    Dec. 22, 2011

(30) Foreign Application Priority Data

Jun. 18, 2010  (JP) ................................ 2010-139875

(51) Int. Cl.
*H01L 29/06* (2006.01)

(52) U.S. Cl. ........ 257/15; 257/22; 257/97; 257/E29.005

(58) Field of Classification Search ............... 257/15, 257/22, 97, E29.005
See application file for complete search history.

(56) References Cited

U.S. PATENT DOCUMENTS

| | | | |
|---|---|---|---|
| 7,635,875 B2 * | 12/2009 | Niki et al. | 257/98 |
| 7,683,386 B2 * | 3/2010 | Tanaka et al. | 257/88 |
| 2011/0101419 A1 * | 5/2011 | Hata et al. | 257/190 |

FOREIGN PATENT DOCUMENTS

| | | |
|---|---|---|
| JP | 3819398 | 6/2006 |
| JP | 3987879 | 7/2007 |

* cited by examiner

*Primary Examiner* — Trung Q Dang
(74) *Attorney, Agent, or Firm* — Turocy & Watson, LLP

(57) ABSTRACT

According to one embodiment, a nitride semiconductor device includes a substrate, an $Al_{x1}Ga_{1-x1}N$ first buried layer, an $In_yAl_zGa_{1-y-z}N$ buried layer and an $Al_{x2}Ga_{1-x2}N$ second buried layer. The substrate has protrusions formed in an in-plane direction on a first major surface, and a depression between adjacent ones of the protrusions. The first buried layer is formed on the depression and one of the protrusions. The $In_yAl_zGa_{1-y-z}N$ buried layer is formed on the first buried layer. The second buried layer is formed on the $In_yAl_zGa_{1-y-z}N$ buried layer. A portion of the first buried layer formed on the depression and a portion of the first buried layer formed on the one of the protrusions are not connected to each other. A portion of the $In_yAl_zGa_{1-y-z}N$ buried layer formed above the depression and a portion of the $In_yAl_zGa_{1-y-z}N$ buried layer formed above the one of the protrusions are connected to each other.

20 Claims, 8 Drawing Sheets

NITRIDE SEMICONDUCTOR DEVICE

CROSS-REFERENCE TO RELATED APPLICATIONS

This application is based upon and claims the benefit of priority from the prior Japanese Patent Application No. 2010-139875, filed on Jun. 18, 2010; the entire contents of which are incorporated herein by reference.

FIELD

Embodiments described herein relate generally to a nitride semiconductor device.

BACKGROUND

Demand for white LEDs (Light Emitting Diodes) is rapidly increasing as white light sources for cell phone LCD (Liquid Crystal Display) parts, LCD televisions, and lighting fixtures. A white LED is based on an LED for emitting blue light or ultraviolet light. On the other hand, semiconductor lasers for emitting blue light or ultraviolet light are used in such applications as pickup light sources for reading and writing high-density optical discs and automotive headlamps. Furthermore, HEMTs (High Electron Mobility Transistors) are used as high-power semiconductor devices for motor control in cars and trains. These LEDs, semiconductor lasers, and HEMTs are formed by crystal growth of a nitride semiconductor made of $In_yAl_zGa_{1-y-z}N$ ($0<y\leq1$, $0\leq z\leq1$) on a sapphire or other substrate. Crystal defects in a nitride semiconductor decrease the internal quantum efficiency of the light emitting device such as LED and semiconductor laser. Furthermore, crystal defects accelerate the degradation of the light emitting device and impair its reliability. In electron devices such as HEMT, crystal defects decrease the electron mobility and lead to power loss. In order to reduce crystal defects in the nitride semiconductor layer made of $In_yAl_zGa_{1-y-z}N$ to improve the light emission efficiency and reliability of the light emitting device, the nitride semiconductor layer made of $In_yAl_zGa_{1-y-z}N$ is formed on a sapphire substrate with a pattern of depressions and protrusions formed on the substrate surface.

BRIEF DESCRIPTION OF THE DRAWINGS

FIG. 1A is a plan view of the substrate surface, and FIG. 1B is a sectional view taken along line A-A as viewed in the direction of the arrows in FIG. 1A;

DETAILED DESCRIPTION

In general, according to one embodiment, a nitride semiconductor device includes a substrate, an $Al_{x1}Ga_{1-x1}N$ ($0\leq x1\leq1$) first buried layer, an $In_yAl_zGa_{1-y-z}N$ ($0<y\leq1$, $0\leq z\leq1$) buried layer and an $Al_{x2}Ga_{1-x2}N$ ($0\leq x2\leq1$) second buried layer. The substrate has a plurality of protrusions formed in an in-plane direction on a first major surface, and a depression between adjacent ones of the protrusions. The $Al_{x1}Ga_{1-x1}N$ ($0\leq x1\leq1$) first buried layer is formed on the depression and one of the protrusions of the substrate. The $In_yAl_zGa_{1-y-z}N$ ($0<y\leq1$, $0\leq z\leq1$) buried layer is formed on the $Al_{x1}Ga_{1-x1}N$ first buried layer. The $Al_{x2}Ga_{1-x2}N$ ($0\leq x2\leq1$) second buried layer is formed on the $In_yAl_zGa_{1-y-z}N$ buried layer. A portion of the $Al_{x1}Ga_{1-x1}N$ first buried layer formed on the depression and a portion of the $Al_{x1}Ga_{1-x1}N$ first buried layer formed on the one of the protrusions are not connected to each other, and a portion of the $In_yAl_zGa_{1-y-z}N$ buried layer formed above the depression and a portion of the $In_yAl_zGa_{1-y-z}N$ buried layer formed above the one of the protrusions are connected to each other.

Embodiments of the invention will now be described with reference to the drawings. The figures used for description in the embodiments are schematic to facilitate description. The shape, dimension, and size relation of the components in the figures are not necessarily implemented just as shown, but can be appropriately modified as long as the effects of the invention are achieved.

First Embodiment

Figure 1A:
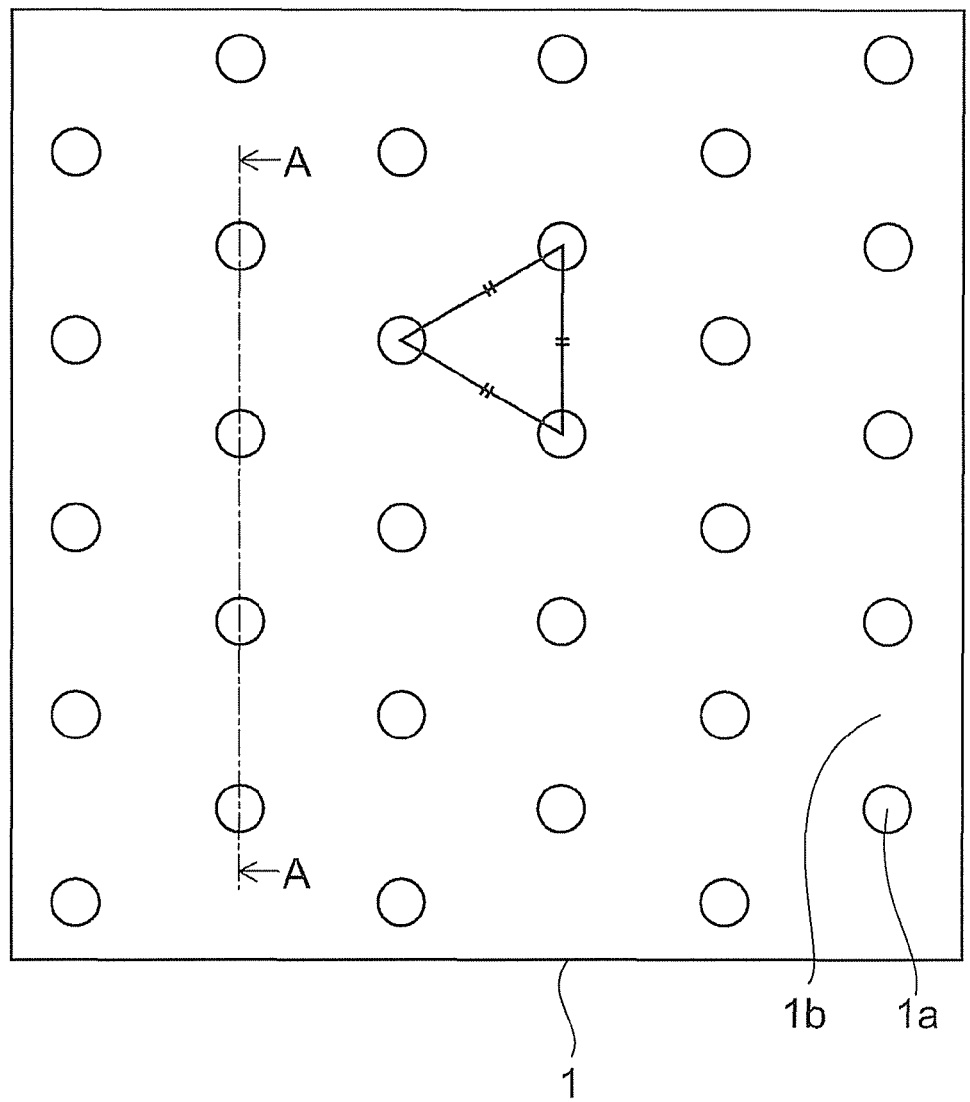
FIGS. 1A and 1B show the major part of an example of the substrate in the first embodiment, where
Figure 1B:
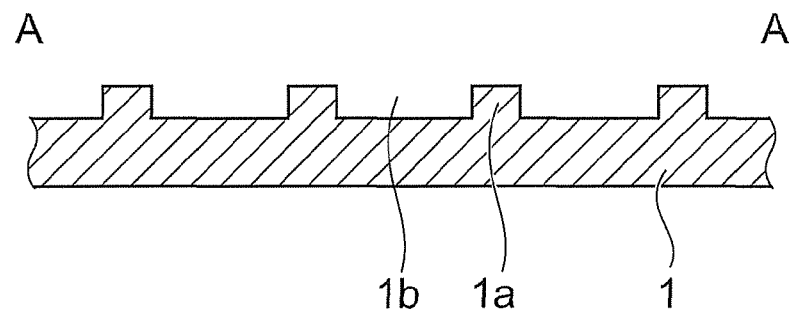
Figure 2:
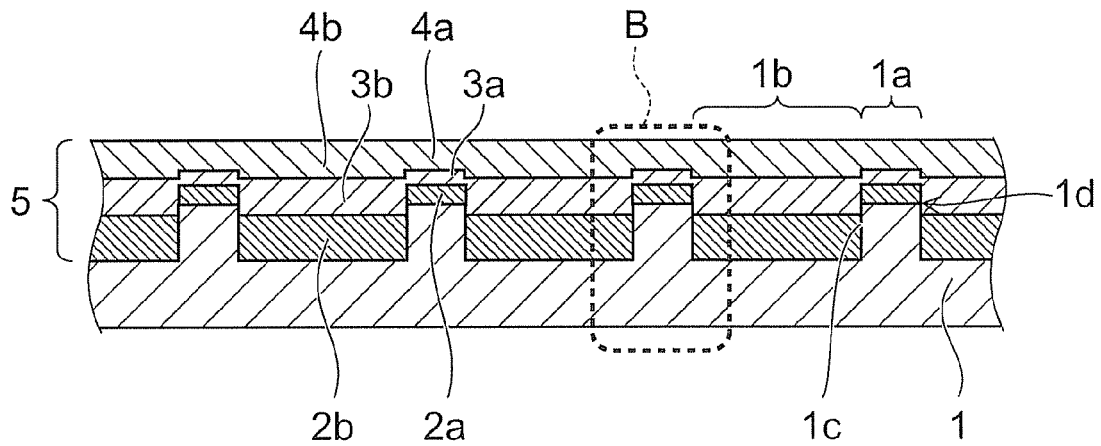
FIG. 2 shows the structure of the major part of the first embodiment, and is a sectional view taken along line A-A as viewed in the direction of the arrows in FIG. 1A.
Figure 3:
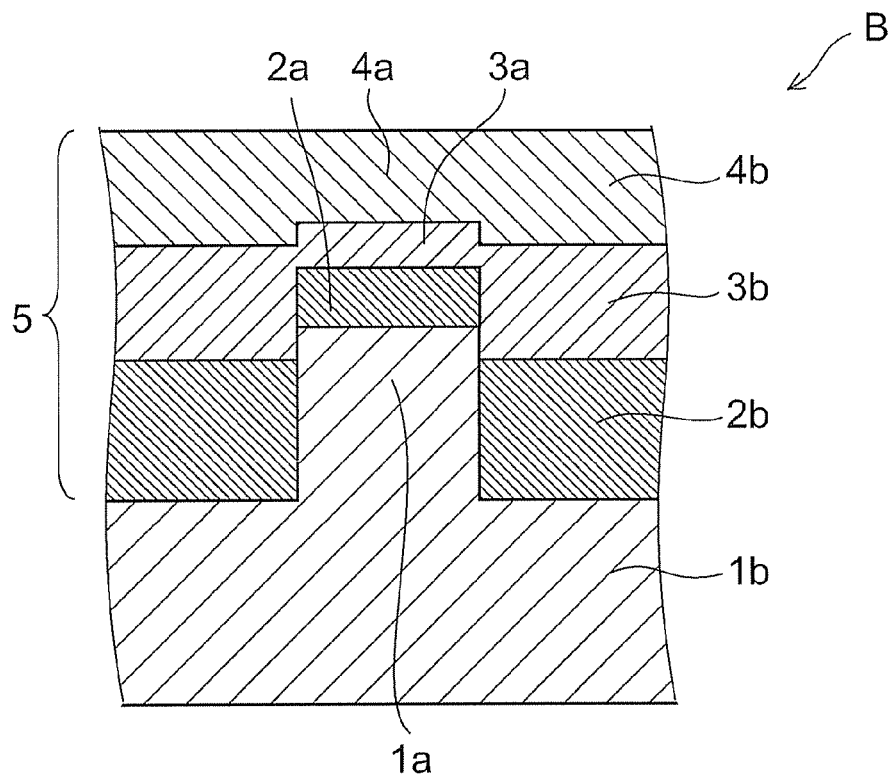
FIG. 3 is an enlarged view of part B of FIG. 2.

The main structure of a first embodiment of the invention is described with reference to FIGS. 1A to 5. Furthermore, the main structure of a comparative embodiment to be compared with the first embodiment is described with reference to FIGS. 6A to 6D. FIGS. 1A and 1B show the major part of an example of the substrate used in the first embodiment, where FIG. 1A is a plan view of the substrate surface, and FIG. 1B is a sectional view taken along line A-A as viewed in the direction of the arrows in FIG. 1A. FIG. 2 shows the structure of the major part of a nitride semiconductor light emitting device according to the first embodiment, and is a sectional view taken along line A-A as viewed in the direction of the arrows in FIG. 1A. FIG. 3 is an enlarged view of part B of FIG. 2. FIGS. 4A to 4D show a manufacturing process for the major part of the nitride semiconductor light emitting device according to the first embodiment, and are sectional views taken along line A-A as viewed in the direction of the arrows in FIG. 1A. FIG. 5 is a graph showing the relationship between the solid phase ratio of In in the InGaN layer and the critical layer thickness. FIGS. 6A to 6D show a manufacturing process for the major part of the comparative embodiment, and are sectional views taken along line A-A as viewed in the direction of the arrows in FIG. 1A.

FIGS. 1A and 1B show the major part of a substrate used in this embodiment. Depressions 1b and protrusions is are formed on the surface (first major surface) of the substrate 1. For growth of a nitride semiconductor, the substrate 1 is a substrate made of a material of the hexagonal system, such as sapphire substrate and SIC substrate. Alternatively, a Si substrate or GaAs substrate with GaN thickly formed thereon can also be used. Here, a sapphire substrate is taken as an example. Furthermore, by way of example, the substrate surface is a (0001) plane.

As shown in FIG. 1A, a plurality of protrusions 1a are arranged on the surface of the substrate 1. A region constituting the depression 1b is formed between the adjacent protrusions 1a on the surface of the substrate 1. That is, on the surface of the substrate 1, the region where the protrusions 1a are not formed is a region lower than the upper surface of the protrusion 1a and forms a depression-like region between the protrusions 1a. Thus, in the description of the following embodiments, on the surface of the substrate 1, the region except the protrusions 1a is referred to as depression 1b. On the surface of the substrate 1, the above protrusions 1a and depressions 1b are successively formed in the in-plane direction.

By way of example, the protrusion 1a is formed in a cylindrical shape with the upper surface having a generally circular shape. As seen in the cross section of the substrate shown in FIG. 1B, with regard to the dimension of the depression 1b and the protrusion 1a, for instance, the protrusion 1a has a width of 1 μm and a height of 1 μm, and the depression 1b has a width of 3 μm. Here, the height of the protrusion 1a is the difference in height between the upper surface of the protrusion 1a and the surface of the substrate 1 (bottom surface of the depression 1b). The width of the depression 1b is the shortest gap between the protrusions 1a, i.e., the gap between the adjacent protrusions 1a. The dimensions described here are illustrative only, and can be modified in accordance with the design of the nitride semiconductor device.

FIG. 2 shows a stacked structure 5. In the stacked structure 5, a nitride semiconductor layer is stacked on the substrate 1 on which a plurality of depressions 1b and protrusions 1a shown in FIGS. 1A and 1B are formed. FIG. 3 is an enlarged view of region B in FIG. 2. FIG. 3 illustrates the horizontal junction relationship between the layers on the protrusion 1a and the layers on the depression 1b of the substrate 1 in the stacked structure 5.

The stacked structure 5 is composed of a GaN first buried layer 2, an InGaN buried layer 3, and a GaN second buried layer 4. Each of these layers may be either an undoped layer, i.e., a layer not doped with impurity, or a layer doped with n-type impurity. The GaN first buried layer 2 is made of a portion 2b formed on the bottom surface of the depression 1b of the substrate 1 and a portion 2a formed on the upper surface of the protrusion 1a of the substrate 1. In the following, the "portion formed on (or above) the bottom surface of the depression 1b of the substrate 1" is simply referred to as "portion formed on (or above) the depression 1b of the substrate 1", and the "portion formed on (or above) the upper surface of the protrusion is of the substrate 1" is simply referred to as "portion formed on (or above) the protrusion 1a of the substrate 1". This also applies similarly to the InGaN buried layer 3 and the GaN second buried layer 4.

The thickness of the GaN first buried layer 2b formed on the depression 1b is 0.9 μm. The thickness of the GaN first buried layer 2a formed on the protrusion 1a is equal to or less than the thickness of the GaN first buried layer 2b formed on the depression, and is 0.3 μm in this embodiment. In this embodiment, the GaN first buried layer 2b formed on the depression 1b and the GaN first buried layer 2a formed on the protrusion 1a are not connected to each other along the in-plane direction as viewed in the plane parallel to the surface of the substrate 1. Of the planes parallel to the surface of the substrate 1, there exists no plane which simultaneously traverses the GaN first buried layer 2b formed on the depression 1b and the GaN first buried layer 2a formed on the protrusion 1a and connects them to each other. The upper surface of the GaN first buried layer 2b formed on the depression 1b is formed at a lower position than the bottom surface of the GaN first buried layer 2a formed on the protrusion 1a. In other words, the upper surface of the protrusion 1a of the substrate 1 is at a higher position than the upper surface of the GaN first buried layer 2b formed on the depression 1b. Hence, they are not horizontally connected to each other.

An InGaN buried layer 3 is formed on the GaN first buried layer 2. The InGaN buried layer 3 is also made of an InGaN buried layer 3b formed above the depression 1b and an InGaN buried layer 3a formed above the protrusion 1a. The thickness of the InGaN buried layer 3b formed above the depression 1b is 0.5 μm. The thickness of the InGaN buried layer 3a formed above the protrusion 1a is equal to or less than the thickness of the InGaN buried layer 3b formed above the depression 1b, and is 0.2 μm in this embodiment. In this embodiment, the total thickness of the GaN first buried layer 2b and the InGaN buried layer 3b formed on the depression 1b is 1.4 μm. The sum of the height of the protrusion 1a of the substrate 1 and the thickness of the GaN first buried layer 2a formed on the protrusion 1a is 1.3 μm. Hence, the InGaN buried layer 3b formed above the depression 1b and the InGaN buried layer 3a formed above the protrusion 1a are horizontally connected to each other in the region having a width of 0.1 μm in the stacking direction. That is, in this region, the InGaN buried layer 3b formed above the depression 1b and the InGaN buried layer 3a formed above the protrusion 1a are connected to each other along the in-plane direction as viewed in the plane parallel to the surface of the substrate 1. In other words, of the planes parallel to the surface of the substrate 1, there exists a plane which simultaneously traverses the InGaN buried layer 3b formed above the depression 1b and the InGaN buried layer 3a formed above the protrusion 1a and connects them to each other. The upper surface of the InGaN buried layer 3b formed above the depression 1b is formed at a position 0.1 μm higher than the bottom surface of the InGaN buried layer 3a formed above the protrusion 1a (or the upper surface of the GaN first buried layer 2a formed on the protrusion 1a). Hence, they are horizontally connected to each other in this structure.

A GaN second buried layer 4 is formed on the InGaN buried layer 3. The GaN second buried layer 4 is also made of a GaN second buried layer 4b formed above the depression 1b and a GaN second buried layer 4a formed above the protrusion 1a. The thickness of the GaN second buried layer 4b formed above the depression 1b is 1.2 μm. The thickness of the GaN second buried layer 4a formed above the protrusion 1a is equal to or less than the thickness of the GaN second buried layer 4b formed above the depression 1b, and is 1.1 μm in this embodiment. In this embodiment, the total thickness of the GaN first buried layer 2b, the InGaN buried layer 3b, and the GaN second buried layer 4b formed on the depression 1b is 2.6 μm. On the other hand, the sum of the height of the protrusion 1a of the substrate 1 and the thickness of the GaN first buried layer 2a, the InGaN buried layer 3a, and the GaN second buried layer 4a formed on the protrusion 1a is 2.6 μm. The upper surface of the GaN second buried layer 4b formed above the depression 1b is generally flush with the upper surface of the GaN second buried layer 4a formed above the protrusion 1a. Thus, the upper surface of the GaN second buried layer 4 is formed flat.

The manufacturing process in the aforementioned cross section of FIG. 3 is described with reference to FIGS. 4A to 4D. FIGS. 4A to 4D are sectional views taken along line A-A as viewed in the direction of the arrows in FIG. 1A. On the surface of a sapphire substrate 1, a mask pattern, not shown, is formed at the position where the protrusion pattern shown in FIG. 1A is to be formed. The surface of the sapphire substrate 1 exposed through the mask is dry etched by e.g. RIE (Reactive Ion Etching). Thus, a protrusion 1a is formed below the mask, and a depression 1b is formed in the etched region. The height of the protrusion 1a can be adjusted by the etching time. The height of the protrusion is illustratively 1.0 µm.

On the surface of the sapphire substrate 1 with protrusions 1a and depressions 1b patterned as shown in FIGS. 1A and 1B, a stacked structure 5 sequentially composed of a GaN first buried layer 2, an InGaN buried layer 3, and a GaN second buried layer 4 is formed by e.g. the MOCVD (Metal Organic Chemical Vapor Deposition) method.

Figure 4A:
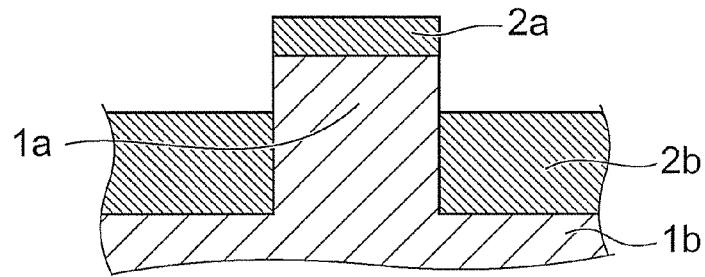
FIGS. 4A to 4D show a manufacturing process for the major part of the first embodiment, and are sectional views taken along line A-A as viewed in the direction of the arrows in FIG. 1A.
Figure 5:
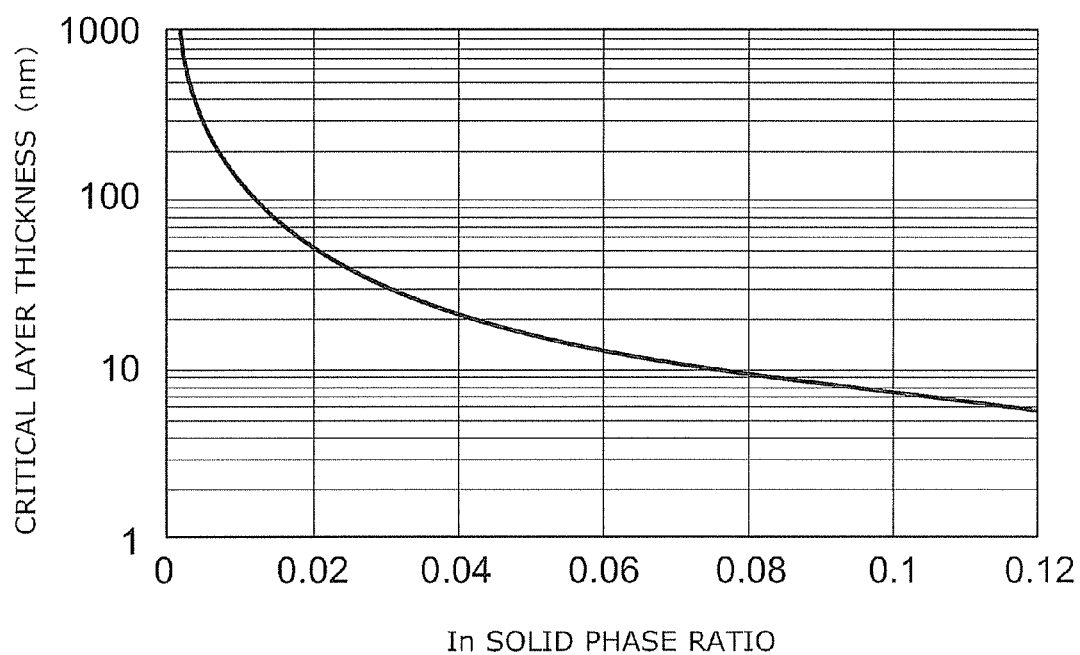
FIG. 5 is a graph showing the relationship between the solid phase ratio of In in the InGaN layer and the critical layer thickness.

As shown in FIG. 4A, the GaN first buried layer 2 is formed on each of the depression 1b and the protrusion is of the sapphire substrate 1. By suitably setting the crystal growth condition, the growth rate can be made higher on the depression 1b than on the protrusion 1a. Furthermore, the crystal growth is performed under the growth condition that the nitride semiconductor does not grow on the sidewall is of the protrusion 1a of the substrate 1. If a GaN first buried layer is grown under such condition, the upper surface of the GaN first buried layer 2b formed on the depression 1b of the substrate 1 rises faster than the upper surface of the GaN first buried layer 2a formed on the protrusion is of the substrate 1. Furthermore, the upper surface of the GaN first buried layer 2b formed on the depression 1b of the substrate 1 rises along the sidewall 1c of the protrusion 1a of the substrate 1. By forming the subsequent layers of the stacked structure 5 under such condition, the surface of the stacked structure 5 can be finally formed flat. Before the upper surface of the GaN first buried layer 2b formed on the depression reaches the upper surface of the substrate protrusion 1a, the growth of the GaN first buried layer 2 is terminated. The upper surface of the protrusion 1a of the substrate 1 is formed at a higher position than the upper surface of the GaN first buried layer 2b formed on the depression 1b. That is, the crystal growth of the GaN first buried layer 2 is terminated before the GaN first buried layer on the depression 1b and the GaN first buried layer on the protrusion 1a are horizontally connected. Furthermore, because the GaN first buried layer is grown under the growth condition of avoiding growth on the sidewall is of the protrusion 1a of the substrate 1, the GaN first buried layer is scarcely formed on the sidewall is of the protrusion 1a of the substrate 1. That is, the GaN first buried layer 2a on the protrusion 1a of the substrate 1 and the GaN first buried layer 2b on the depression 1b are spaced from each other. In this embodiment, the growth of GaN is terminated when the layer thickness of the GaN first buried layer 2 reaches 0.9 µm on the depression 1b and 0.3 µm on the protrusion 1a.

Figure 4B:
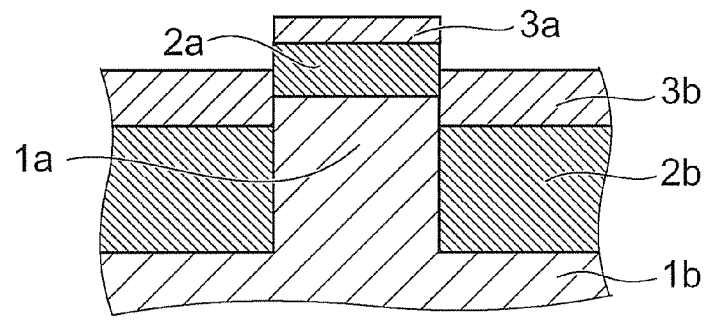
Figure 4C:
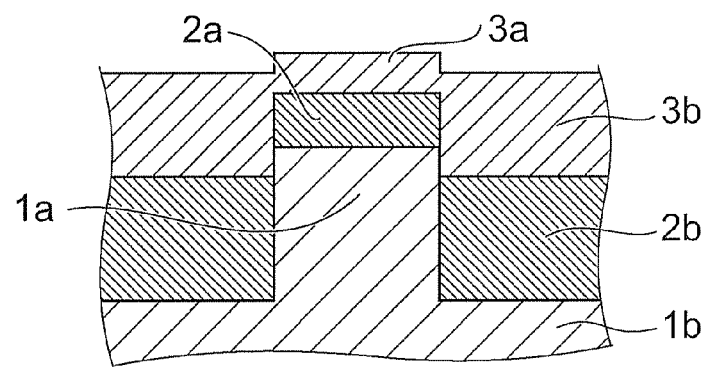

Subsequently, as shown in FIGS. 4B and 4C, an InGaN buried layer 3 is continuously formed on the GaN first buried layer 2. Unlike the above growth condition of the GaN first buried layer 2, the InGaN buried layer 3 is grown under the condition that the growth rate is higher above the depression 1b than above the protrusion 1a and is negligible on the sidewall of the GaN first buried layer 2a on the protrusion 1a as compared with the growth rate above the protrusion 1a and above the depression 1b. First, the upper surface of the InGaN buried layer 3b above the depression 1b gradually rises along the sidewall is of the protrusion 1a of the substrate 1. The upper surface of the InGaN buried layer 3b above the depression 1b exceeds the upper surface of the protrusion is of the substrate 1, and subsequently rises along the sidewall of the GaN first buried layer 2a on the protrusion 1a (FIG. 4B). The growth is further continued, and the upper surface of the InGaN buried layer 3b above the depression 1b exceeds the upper surface of the GaN first buried layer 2a on the protrusion 1a. Then, the growth proceeds along the sidewall of the InGaN buried layer 3a above the protrusion 1a (FIG. 4C). Thus, the growth of InGaN proceeds so that the upper surface of the InGaN buried layer 3b above the depression 1b rises along the sidewall of the InGaN buried layer 3a above the protrusion 1a. Accordingly, the InGaN buried layer 3b above the depression 1b and the InGaN buried layer 3a above the protrusion 1a are horizontally connected in the plane parallel to the substrate surface. The InGaN buried layer 3 is grown until the InGaN buried layer 3 reaches a layer thickness of 0.5 µm above the depression 1b and a layer thickness of 0.2 µm above the protrusion 1a, and until the thickness of the connecting portion between the InGaN buried layer 3b above the depression 1b and the InGaN buried layer 3a above the protrusion is reaches 0.1 µm.

In InGaN, according as the ratio of In in the solid phase (solid phase ratio) is larger, the lattice mismatch with GaN is larger, and crystal fracture occurs above a certain thickness. This layer thickness at which crystal fracture starts is called the critical layer thickness. FIG. 5 shows the relationship between the solid phase ratio and the critical layer thickness, where the solid phase ratio is defined as the ratio of In to the total group III elements of InGaN. The solid phase ratio is denoted by x in the formula $In_x(Ga_{1-x})N$. To avoid the crystal fracture of InGaN, crystal growth is performed so that the layer thickness is thinner, or the In solid phase ratio is smaller, than that of the graph of FIG. 5. In this embodiment, InGaN above the depression 1b is grown to a layer thickness of 0.5 µm. Hence, from FIG. 5, to avoid crystal fracture, the In solid phase ratio is set to 0.003 or less.

Figure 4D:
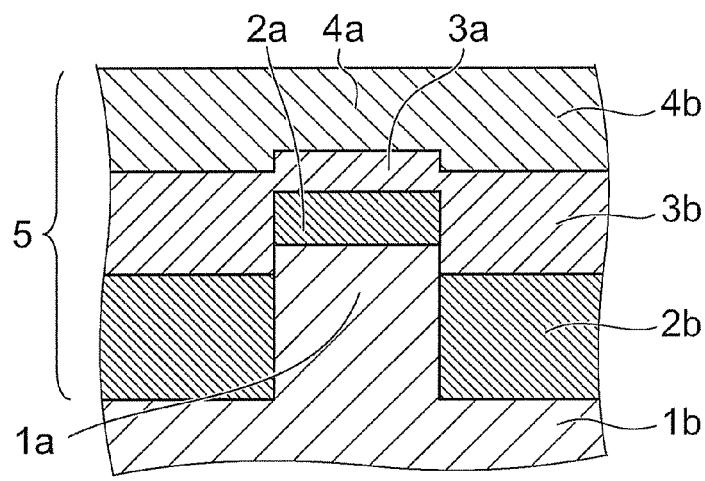

Subsequently, as shown in FIG. 4D, a GaN second buried layer 4 is formed on the InGaN buried layer 3. The growth condition for this growth is such that in the initial stage, like the above GaN first buried layer 2, the growth rate is faster above the depression 1b than above the protrusion 1a. However, the difference therebetween is gradually eliminated. Finally, the surface of the GaN second buried layer 4 is flattened. The growth is terminated when the GaN second buried layer 4 reaches a layer thickness of 1.2 µm above the depression 1b and 1.1 µm above the protrusion 1a. At this time, the upper surface of the GaN second buried layer 4b above the depression 1b is horizontally aligned with the upper surface of the GaN second buried layer 4a above the protrusion 1a. Thus, the surface of the GaN second buried layer 4 is formed flat. The above layer thickness of the GaN second buried layer is illustratively only. In accordance with the change of the growth condition, the layer thickness for flattening the GaN second buried layer 4 is changed.

Thus, on the sapphire substrate 1 having depressions 1b and protrusions 1a on the surface, a stacked structure 5 made of nitride semiconductors is formed. The stacked structure 5 is composed of a GaN first buried layer 2, an InGaN buried layer 3, and a GaN second buried layer 4, and has a flat surface. That is, a substrate provided thereon with a nitride semiconductor layer having a flat surface is produced. By forming a light emitting region such as LED and semiconductor laser on this substrate, a nitride semiconductor light emitting device can be formed. Alternatively, by forming a channel region of HEMT and MISFET (Metal Insulator Semiconductor Field Effect Transistor) on this substrate, a nitride semiconductor device can be formed.

Next, a manufacturing method of a comparative example is described. In the structure manufactured by this method, on a sapphire substrate 1 having depressions 1b and protrusions 1a on the surface, a GaN first buried layer 2 is stacked until the surface is flattened. In the first embodiment, a nitride semiconductor layer with a flattened surface is formed by forming a stacked structure 5 made of a GaN first buried layer 2, an InGaN buried layer 3, and a GaN second buried layer 4. In contrast, in this comparative example, a nitride semiconductor layer with a flattened surface is formed from a GaN first buried layer 2 alone. FIGS. 6A to 6D show the manufacturing process in sectional views taken along line A-A as viewed in the direction of the arrows in FIG. 1A. As in the first embodiment, on a sapphire substrate 1 having depressions 1b and protrusions 1a shown in FIGS. 1A and 1B, a GaN layer is grown by the MOCVD method. As in the first embodiment, the growth is performed under the growth condition that the growth rate of the GaN first buried layer on the depression 1b is faster than the growth rate on the protrusion 1a.

Figure 6A:
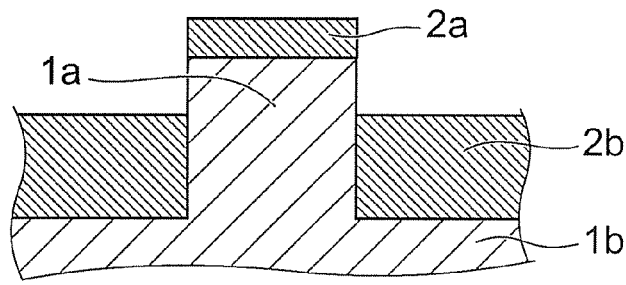
FIGS. 6A to 6D show a manufacturing process for the major part of a comparative embodiment, and are sectional views taken along line A-A as viewed in the direction of the arrows in FIG. 1A.

As in the first embodiment, in the initial stage of growth, as shown in FIG. 6A, the upper surface of the GaN first buried layer 2b formed on the depression 1b of the substrate 1 rises faster than the upper surface of the GaN first buried layer 2a formed on the protrusion is of the substrate 1. Furthermore, the upper surface of the GaN first buried layer 2b formed on the depression 1b of the substrate 1 rises along the sidewall 1c of the protrusion 1a of the substrate 1. In the first embodiment, the GaN first buried layer 2 is grown so that the upper surface of the GaN first buried layer 2b formed on the depression 1b is lower than the upper surface of the substrate protrusion 1a. That is, the GaN first buried layer 2 is formed so that the GaN first buried layer 2b on the depression 1b and the GaN first buried layer 2a on the protrusion is are not horizontally connected. Furthermore, because the GaN first buried layer 2 is grown under the growth condition of avoiding growth on the sidewall is of the protrusion is of the substrate 1, the GaN first buried layer 2 is not formed on the sidewall 1c of the protrusion 1a of the substrate 1. That is, the GaN first buried layer 2a on the protrusion 1a of the substrate 1 and the GaN first buried layer 2b on the depression 1b are spaced from each other.

Figure 6B:
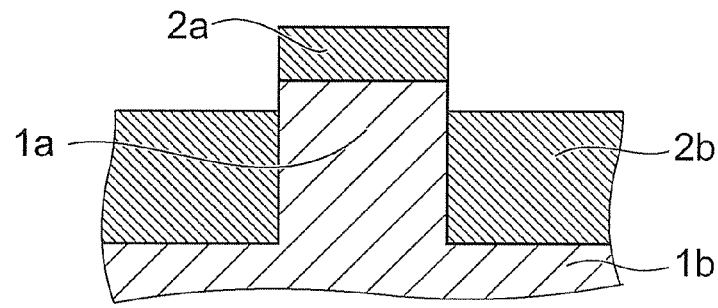
Figure 6C:
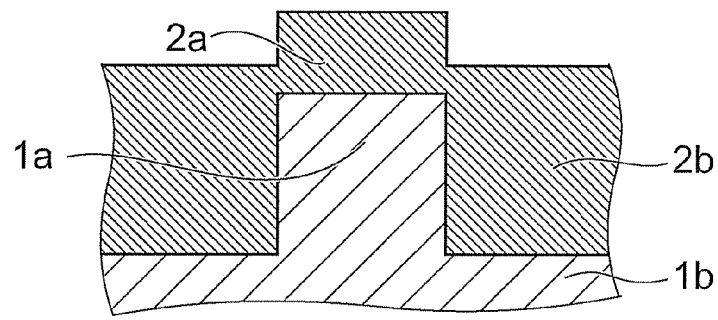
Figure 6D:
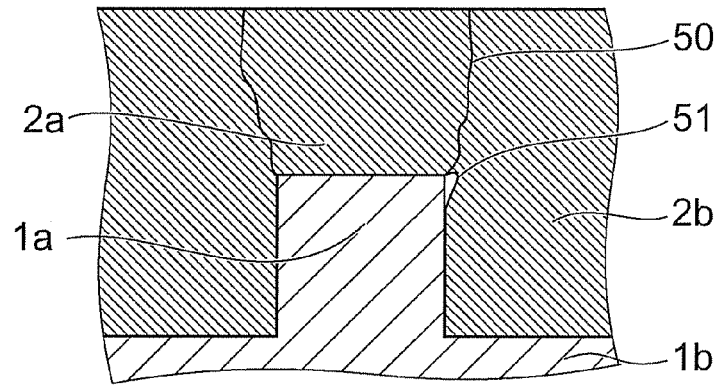

In contrast, in this comparative example, as shown in FIGS. 6B and 6C, the growth of the GaN first buried layer 2 is further continued. The upper surface of the GaN first buried layer 2b on the depression 1b exceeds the upper surface of the protrusion 1a of the substrate 1. Then, the upper surface of the GaN first buried layer 2b on the depression 1b rises along the sidewall of the GaN first buried layer on the protrusion 1a (FIG. 6C). Thus, the growth proceeds so that the upper surface of the GaN first buried layer 2b on the depression 1b rises along the sidewall of the GaN first buried layer 2a on the protrusion 1a. Accordingly, the GaN first buried layer 2b on the depression 1b and the GaN buried layer 2a on the protrusion 1a are horizontally connected in the plane parallel to the substrate surface. As the growth is further continued, the difference in height between the protrusion and the depression decreases. Finally, as shown in FIG. 6D, the upper surface of the GaN first buried layer 2 is flattened. Thus, a substrate provided thereon with a nitride semiconductor layer having a flat surface is obtained. In order to match the thickness of the nitride semiconductor layer with that in the first embodiment, the growth is terminated when the thickness of the GaN first buried layer 2b on the depression 1b reaches 2.6 μm. Subsequently, by forming a light emitting region such as LED and semiconductor laser further thereon, a nitride semiconductor device such as a nitride semiconductor light emitting device can be formed.

The surface of the nitride semiconductor layer of the comparative example formed as described above was etched for 30 seconds with KOH melt at 360° C. By electron microscopy, the etch pit density of the surface was evaluated as $5 \times 10^7/cm^2$. The etch pit density reflects the crystal defect density, and mainly reflects the dislocation density in the crystal. In the comparative example, as shown in FIG. 6D, the crystal includes many dislocations 50 originating from the corner where the upper surface and the side surface of the protrusion 1a of the substrate 1 intersect. Furthermore, at the corner, there may exist a void where no crystal growth occurs. It is considered that these crystal defects are generated in the following manner.

When the state of FIG. 6B transitions to that of FIG. 6C, the upper surface of the GaN first buried layer 2b on the depression 1b has risen along the sidewall 1c of the protrusion 1a of the substrate 1. However, after exceeding the upper surface of the protrusion 1a of the substrate 1, the upper surface of the GaN first buried layer 2b on the depression 1b rises along the sidewall of the GaN first buried layer 2a formed on the protrusion 1a. That is, the GaN first buried layer 2b on the depression 1b and the GaN buried layer 2a on the protrusion 1a start to be connected to each other in the horizontal direction along the upper surface of the protrusion 1a of the substrate 1. At this time, the phase of crystal growth of the GaN first buried layer 2b on the depression 1b may not be matched with the phase of crystal growth of the GaN first buried layer 2a on the protrusion 1a. It is considered that this generates a dislocation 50. Here, the phase of crystal growth is a quantity indicating the stage of progress in the period of the crystal structure (such as the order in the periodic sequence of group III atoms and group V atoms). If the growth of the GaN first buried layer is further continued, the dislocation 50 originating from the corner where the upper surface and the sidewall of the protrusion 1a of the substrate 1 intersect reaches the surface of the nitride semiconductor layer. On the other hand, the nitride semiconductor layer made of the stacked structure 5 of the first embodiment was similarly evaluated for etch pit density. The etch pit density was $5 \times 10^6/cm^2$. That is, crystal defects were reduced relative to the comparative example. The reason for this is considered as follows.

In the comparative example, the crystal growth of the GaN first buried layer 2 is performed until the upper surface of the GaN first buried layer 2b formed on the depression 1b reaches the upper surface of the substrate protrusion 1a so that the GaN first buried layer on the depression 1b and the GaN first buried layer on the protrusion 1a are horizontally connected. In contrast, in the first embodiment, the GaN first buried layer 2 is grown so that the upper surface of the GaN first buried layer 2b formed on the depression 1b is lower than the upper surface of the substrate protrusion 1a. That is, the GaN first buried layer 2 is formed so that the GaN first buried layer 2b on the depression 1b and the GaN first buried layer 2a on the protrusion 1a are not horizontally connected. At this time, as described above, they are not connected even via the sidewall 1c of the protrusion is of the substrate 1, but are spaced from each other. Subsequently, an InGaN layer 3 is continuously grown. When the upper surface of the InGaN buried layer 3b above the depression 1b exceeds the upper surface of the GaN first buried layer 2a on the protrusion 1a, the growth of InGaN proceeds so that the upper surface of the InGaN buried layer 3b above the depression 1b rises along the sidewall of the InGaN buried layer 3a formed above the protrusion 1a.

Accordingly, the InGaN buried layer 3b above the depression 1b and the InGaN buried layer 3a above the protrusion 1a are horizontally connected in the plane parallel to the substrate surface. That is, in the first embodiment, when a nitride semiconductor layer is grown on the substrate 1 having depressions 1b and protrusions 1a, the InGaN buried layers are first horizontally connected in the plane parallel to the surface of the substrate 1.

Thus, on the substrate having depressions and protrusions, a nitride semiconductor layer is formed by forming a GaN layer via InGaN layers horizontally connected in the plane parallel to the substrate surface. It is considered that this serves to achieve the growth of a nitride semiconductor layer with reduced dislocations in the crystal. In growing an In-containing nitride semiconductor with good quality, it is effective to reduce the growth rate and growth temperature. It is considered that this prevents the generation of defects when the separate crystals are connected to each other by crystal growth. That is, in the crystal growth of an In-containing nitride semiconductor, generation of defects in the crystal is suppressed even if the crystal above the depression 1b and the crystal above the protrusion 1a are connected to each other.

As an alternative example, the layers first horizontally connected in the plane parallel to the surface of the substrate can be made of $In_yAl_zGa_{1-y-z}N$ ($0<y\leq1$, $0\leq z\leq1$) rather than InGaN. Also in this case, a similar effect of reducing dislocations in the crystal was achieved. It is considered that in the case where a nitride semiconductor layer is formed on the substrate having depressions and protrusions, dislocation generation in the crystal can be suppressed by allowing In-containing nitride semiconductor layers to be first horizontally connected in the plane parallel to the surface of the substrate 1.

As described above with reference to the first embodiment, a stacked structure 5 is formed on a substrate having depressions and protrusions. In the stacked structure 5, a GaN first buried layer, an InGaN buried layer, and a GaN second buried layer are sequentially formed. In the GaN first buried layer 2, the portion 2b formed on the depression of the substrate and the portion 2a formed on the protrusion are not connected to each other along the in-plane direction parallel to the surface of the substrate. On the other hand, in the InGaN buried layer 3, the portion 3b formed above the depression and the portion 3a formed above the protrusion are connected to each other along the in-plane direction parallel to the surface of the substrate. By using this structure, a nitride semiconductor layer having a flat surface and reduced crystal defects can be obtained. In other words, in the GaN first buried layer, the portion 2b formed on the depression of the substrate and the portion 2a formed on the protrusion are not connected, but spaced from each other. On the other hand, in the InGaN buried layer, the portion 3b formed above the depression and the portion 3a formed above the protrusion are connected to each other. By using this structure, a nitride semiconductor layer having a flat surface and reduced crystal defects can be obtained.

Here, in accordance with the design of the semiconductor light emitting device, the GaN first buried layer and the GaN second buried layer can be made of $Al_{x1}Ga_{1-x1}N$ ($0\leq x1\leq1$) and $Al_{x2}Ga_{1-x2}N$ ($0\leq x2\leq1$), respectively. Also in this case, the same effect as described above is achieved. The InGaN buried layer can be an $In_yAl_zGa_{1-y-z}N$ ($0<y\leq1$, $0\leq z\leq1$) layer as described above. Also in this case, the same effect is achieved. Furthermore, before forming the GaN first buried layer, a GaN layer or AlGaN layer may be formed as a low-temperature buffer layer by crystal growth at a lower growth temperature than that for the GaN first and second buried layer and the InGaN buried layer.

Furthermore, the $In_yAl_zGa_{1-y-z}N$ ($0<y\leq1$, $0\leq z\leq1$) layer can be formed in a superlattice structure in which an $In_{y1}Al_{z1}Ga_{1-y1-z1}N$ ($0<y1\leq1$, $0\leq z1\leq1$) layer having a high In solid phase ratio and an $In_{y2}Al_{z2}Ga_{1-y2-z2}N$ ($0<y2\leq1$, $0\leq z2\leq1$) layer are alternately repeated. Alternatively, in the superlattice structure, an $In_{y1}Al_{z1}Ga_{1-y1-z1}N$ ($0<y1\leq1$, $0\leq z1\leq1$) layer and an $Al_{x1}Ga_{1-x1}N$ ($0\leq x1\leq1$) layer can be alternately and repetitively stacked. In this case, as shown for InGaN in FIG. 5, the relationship between the In solid phase ratio and the critical layer thickness for $In_{y1}Al_{z1}Ga_{1-y1-z1}N$ can be used to set the layer thickness and In solid phase ratio so as to avoid the crystal fracture of $In_{y1}Al_{z1}Ga_{1-y1-z1}N$. The above superlattice structure can include a nitride semiconductor layer having a higher In solid phase ratio, although the thickness of the $In_{y1}Al_{z1}Ga_{1-y1-z1}N$ layer is thinner. Hence, using the above superlattice structure is more effective in suppressing defect generation than using an $In_yAl_zGa_{1-y-z}N$ single layer. For instance, the first embodiment includes an InGaN single layer having a thickness of 0.5 μm and a solid phase ratio of 0.003. This can be replaced by a superlattice structure in which 25 pairs of InGaN having a thickness of 0.01 μm and a solid phase ratio of 0.06 and GaN having a thickness of 0.01 μm are alternately formed.

Also in the structure of the comparative example, crystal defects can be reduced by thickening the thickness of the GaN buried layer 1 from 2.6 μm to e.g. approximately 100 μm. In this case, rather than the MOCVD method, the HVPE (Hydride Vapor Phase Epitaxy) method having a faster growth rate is typically used. However, although crystal defects can be reduced by thickening the GaN buried layer 1, increase in thickness causes the problems of substrate warpage and loss of processing time. This embodiment can provide, without causing such problems, a substrate provided thereon with a nitride semiconductor layer having a flat surface and reduced crystal defects.

Figure 7A:
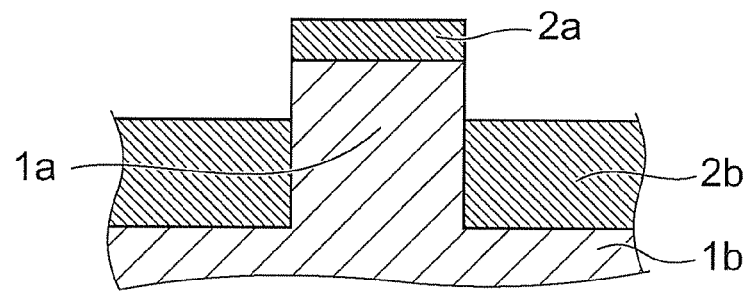
FIGS. 7A to 7C show a manufacturing process for the major part of the variation of the first embodiment, and are sectional views taken along line A-A as viewed in the direction of the arrows in FIG. 1A.
Figure 7B:
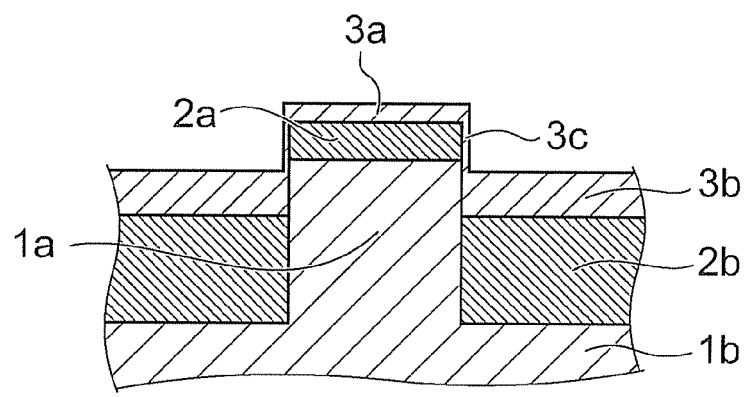
Figure 7C:
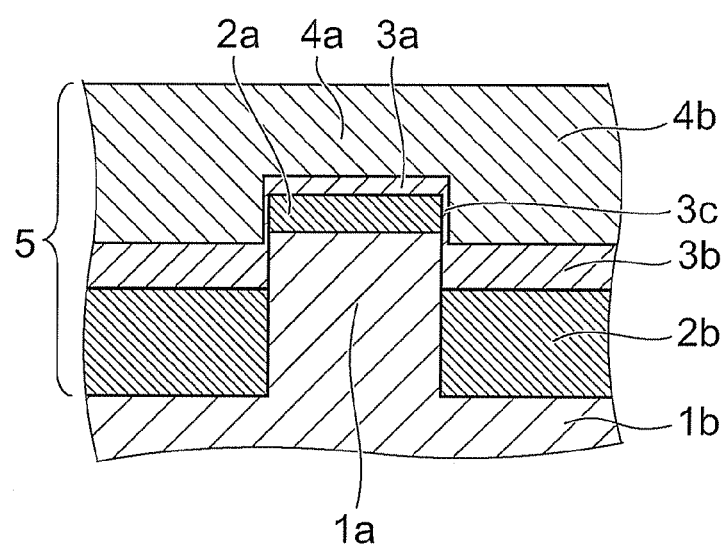

Next, a variation of this embodiment is described with reference to FIGS. 7A to 7C. The portions having the same configuration as described in the first embodiment are labeled with like reference numerals, and the description thereof is omitted. FIGS. 7A to 7C show a manufacturing process for the major part of the variation of the first embodiment, and are sectional views taken along line A-A as viewed in the direction of the arrows in FIG. 1A as in the first embodiment. The figure corresponding to FIG. 2 in the first embodiment is omitted, because the enlarged views of part B in FIG. 2 are shown in FIGS. 7A to 7C.

Like the first embodiment, as shown in FIG. 7A, a GaN first buried layer 2 is grown under the growth condition that the growth rate is higher on the depression 1b than on the protrusion 1a, and that no growth is performed on the sidewall 1c of the protrusion is of the substrate 1. The GaN first buried layer 2 is not formed on the sidewall 1c of the protrusion 1a of the substrate 1. The GaN first buried layer 2b on the depression 1b and the GaN first buried layer 2a on the protrusion is are spaced from each other. The upper surface of the GaN first buried layer 2b formed on the depression 1b is formed at a lower position than the bottom surface of the GaN first buried layer 2a formed on the protrusion 1a. In other words, the upper surface of the protrusion is of the substrate 1 is at a higher position than the upper surface of the GaN first buried layer 2b formed on the depression 1b. In this variation, the thickness is changed from that in the first embodiment. The thickness of the GaN first buried layer 2 on the depression 1b and the protrusion 1a is 0.6 μm and 0.2 μm, respectively.

Next, as shown in FIG. 7B, an InGaN buried layer 3 is grown. The growth condition of the InGaN buried layer 3 is changed from that in the first embodiment. The InGaN buried layer 3 is grown above the depression 1b and above the protrusion 1a under the condition that crystal growth occurs also on the sidewall 1c of the protrusion 1a of the substrate 1. However, as in the first embodiment, the growth rate above the depression 1b is higher than the growth rate above the protrusion 1a, and the growth rate on the sidewall 1c of the protrusion 1a of the substrate 1 is lower than these growth rates. By growing the InGaN buried layer 3 under such growth condition, the InGaN buried layer 3 is formed 0.3 μm above the depression 1b, 0.1 μm above the protrusion 1a, and 0.03 μm on the sidewall 1c of the protrusion 1a and on the sidewall of the GaN first buried layer 2a. The InGaN buried layer 3b above the depression 1b and the InGaN buried layer 3a above the protrusion 1a are connected by the InGaN buried layer 3c grown on the sidewall 1c of the protrusion 1a and on the sidewall of the GaN first buried layer 2a. In this variation, the upper surface of the protrusion 1a of the substrate 1 is formed at a higher position than the upper surface of the InGaN buried layer 3b formed above the depression 1b. These layer thicknesses are illustrative only. It is only necessary to satisfy the following. The upper surface of the InGaN buried layer 3b above the depression 1b is located below the upper surface of the GaN first buried layer 2a on the protrusion 1a. The InGaN buried layer 3c is formed at least on the sidewall of the GaN first buried layer 2a on the protrusion 1a. The InGaN buried layer 3b above the depression 1b and the InGaN buried layer 3a above the protrusion 1a are connected by the InGaN buried layer 3c.

Subsequently, as shown in FIG. 7C, like the first embodiment, a GaN second buried layer 4 is grown on the InGaN buried layer 3 until the surface of the GaN second buried layer 4 is flattened. As an example, the layer thickness of the GaN second buried layer 4 is set so that the stacked structure 5 made of the GaN first buried layer 2, the InGaN buried layer 3, and the GaN second buried layer 4 has a thickness of 2.6 μm, equal to that of the first embodiment. Also in the structure of this variation, the GaN first buried layer 2b on the depression 1b and the GaN first buried layer 2a on the protrusion 1a are not connected, but spaced from each other. On the other hand, the InGaN buried layer 3b above the depression 1b and the InGaN buried layer 3a above the protrusion is are connected to each other. Thus, also in this variation, as in the first embodiment, a nitride semiconductor layer having a flat surface and reduced crystal defects can be obtained on the substrate having depressions and protrusions on the surface.

Also in this variation, as in this embodiment, before forming the GaN first buried layer, a GaN layer or AlGaN layer may be formed as a low-temperature buffer layer by crystal growth at a lower growth temperature than that for the GaN first and second buried layer and the InGaN buried layer.

Second Embodiment

Figure 8:
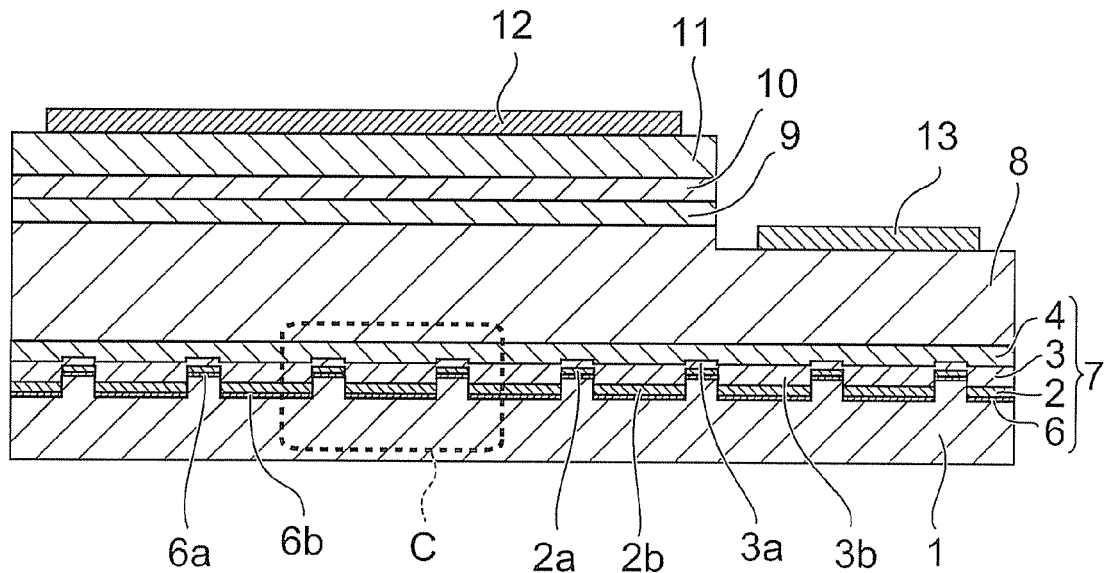
FIG. 8 is a sectional view of the major part of the second embodiment taken along line A-A as viewed in the direction of the arrows in FIG. 1A.
Figure 9:
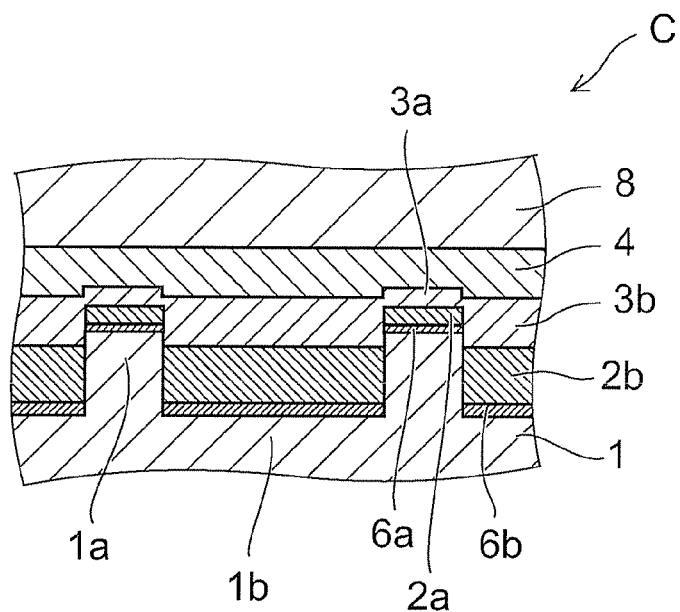
FIG. 9 is an enlarged view of part C in FIG. 8.

A second embodiment of the invention is described with reference to FIGS. 8 and 9. FIG. 8 is a sectional view of the major part of the second embodiment taken along line A-A as viewed in the direction of the arrows in FIG. 1A. FIG. 9 is an enlarged view of part C in FIG. 8. The portions having the same configuration as described in the first embodiment are labeled with like reference numerals, and the description thereof is omitted.

As described above with reference to the first embodiment, a stacked structure 7 having a flat surface is formed on a sapphire substrate 1 with depressions 1b and protrusions 1a provided on the substrate surface. The stacked structure 7 is made of a low-temperature GaN buffer layer 6, a GaN first buried layer 2, an InGaN buried layer 3, and a GaN second buried layer 4. The height and width of the protrusion 1a of the substrate, the width of the depression 1b, and the GaN first buried layer 2, the InGaN buried layer 3, and the GaN second buried layer 4 are the same as those of the first embodiment. In the first embodiment, the low-temperature GaN buffer layer 6 is omitted to simplify the description of the main features of the first embodiment. However, it is understood that the low-temperature GaN buffer layer 6 is also applicable to the first embodiment in a similar manner to the following. In the first embodiment, after the low-temperature GaN buffer layer 6 is previously formed on the protrusions 1a and depressions 1b of the sapphire substrate 1, the stacked structure 5 can be formed. Alternatively, the low-temperature GaN buffer layer 6 can be formed in part of the initial stage of growing the GaN first buried layer. In this embodiment, a 0.03-μm undoped or n-type doped GaN layer is provided as a low-temperature buffer layer between the substrate 1 and the GaN first buried layer 2. Like the GaN first buried layer 2, the GaN low-temperature buffer layer 6 is also made of a GaN low-temperature buffer layer 6b formed on the depression 1b and a GaN low-temperature buffer layer 6a formed on the protrusion 1a. The GaN low-temperature buffer layer 6b formed on the depression 1b and the GaN low-temperature buffer layer 6a formed on the protrusion 1a are not horizontally connected, but spaced from each other, in the plane parallel to the surface of the substrate 1. Thus, the stacked structure 7 is formed via the low-temperature buffer layer 6. This further reduces crystal defects in the nitride semiconductor layer. Furthermore, the low-temperature buffer layer is inherently amorphous, and its own crystal defects do not affect the overlying single-crystal nitride semiconductor. Hence, the low-temperature buffer layers may be connected along the sidewall of the protrusion.

Subsequently, an n-type GaN cladding layer 8 is formed on the GaN second buried layer 4. A multiple quantum well active layer 9 is formed on the n-type GaN cladding layer 8. The multiple quantum well active layer 9 is formed by repeating an $In_{0.05}Ga_{0.95}N$ well layer having a thickness of 0.003 μm and an In solid phase ratio of 0.05 and a GaN barrier layer having a thickness of 0.006 μm. The multiple quantum well active layer 9 includes 20 well layers. On the multiple quantum well active layer 9, a p-type $Al_{0.2}Ga_{0.8}N$ cladding layer 10 having a thickness of 0.05 μm and a p-type GaN contact layer 11 having a thickness of 0.15 μm are sequentially formed.

On the p-type GaN contact layer, a p-type electrode 12 in ohmic contact therewith is formed. On the portion of the n-type GaN cladding layer 8 exposed to the p-type electrode 12 side, an n-type electrode 13 in ohmic contact therewith is formed. The above layers can be formed by the MOCVD method.

A nitride semiconductor light emitting device is thus formed as an LED 100. In the LED 100, by passing a current from the p-type electrode 12 to the n-type electrode 13, light is emitted in the multiple quantum well active layer 9. The light is emitted outside from the front side of the p-type electrode 12 and the back side of the sapphire substrate 1. Total reflection loss of the light propagated toward the sapphire substrate is reduced by the interface of depressions 1b and protrusions 1a on the surface of the sapphire substrate 1. Thus, the light extraction efficiency from the sapphire substrate side is increased. In the LED of this embodiment, the emission wavelength was 380 nm, and the optical output at an operating current of 20 mA was 10 mW. With regard to the electrostatic breakdown voltage characteristics in HB (Human Body) model, the breakdown voltage was 2000 V or more.

On the other hand, the substrate having a nitride semiconductor layer on the surface in the above comparative example shown in FIGS. 6A to 6D was used to produce an LED structure similar to that of this embodiment. In this LED of the comparative example, the emission wavelength was 380 nm, and the optical output at an operating current of 20 mA was 5 mW, which is significantly lower than that of the LED of this embodiment. Furthermore, in the LED of the comparative example, with regard to the electrostatic breakdown voltage characteristics in HB model, the breakdown voltage was approximately 500 V, being very low. Thus, the characteristics of the LED of this embodiment are significantly improved relative to the LED of the comparative example. This is because of the reduction of the crystal defect density of the nitride semiconductor layer formed on the substrate having depressions and protrusions, as described in the first embodiment.

In this embodiment, the layers from the GaN low-temperature buffer layer 6 to the GaN second buried layer 4 are formed on the sapphire substrate 1 to form a stacked structure 7. For simplicity of description, this stacked structure 7 can be referred to as a substrate having a nitride semiconductor layer on the surface. Then, the layers from the n-type GaN cladding layer 8 to the p-type GaN contact layer 11 can be sequentially formed on that substrate. Here, in the process of this embodiment, the layers up to the GaN second buried layer 4 are formed on the sapphire substrate 1 to form a substrate having a nitride semiconductor layer on the surface. Then, crystal growth is suspended, and the substrate is taken out of the MOCVD apparatus. Subsequently, again by the MOCVD method, the layers from the n-type GaN cladding layer 8 to the p-type GaN contact layer 11 can be sequentially formed on the substrate having a nitride semiconductor layer on the surface, i.e., on the GaN second buried layer 4. As an alternative process, by the MOCVD method, on the sapphire substrate 1, the layers from the GaN low-temperature buffer layer 6 to the p-type GaN contact layer 11 can be sequentially formed in a continuous crystal growth.

In this embodiment, the layers from the GaN low-temperature buffer layer 6 to the GaN second buried layer 4 are formed on the sapphire substrate 1 to form a stacked structure 7, as described in the first embodiment with reference to FIGS. 2 to 4D. This stacked structure 7 is used as an example in this embodiment. It is understood that a similar effect is achieved by using the variation of the first embodiment shown in FIGS. 7A to 7C.

Third Embodiment

Figure 10:
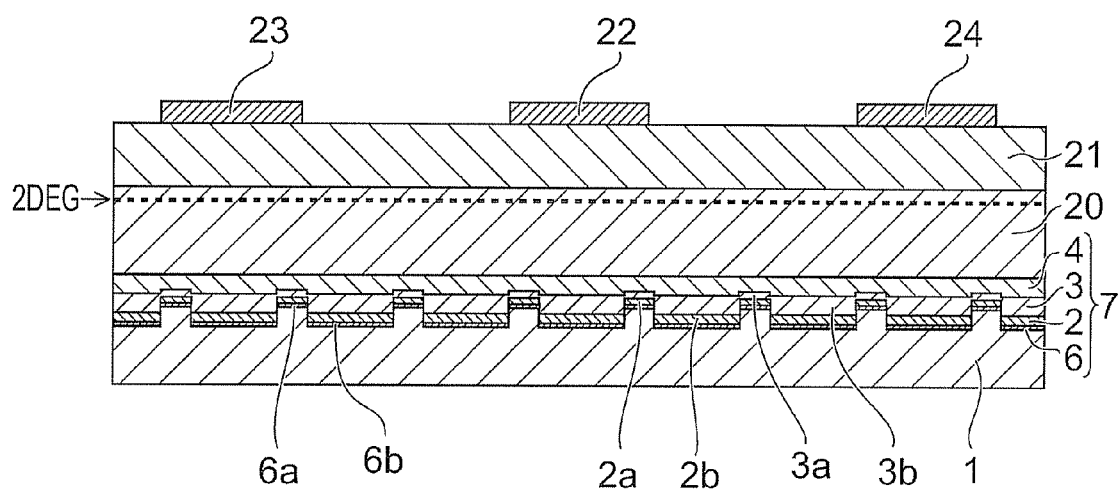
FIG. 10 is a sectional view of the major part of the third embodiment taken along line A-A as viewed in the direction of the arrows in FIG. 1A.

Next, a third embodiment of the invention is described with reference to FIG. 10. FIG. 10 is a sectional view of the major part of the third embodiment taken along line A-A as viewed in the direction of the arrows in FIG. 1A. The portions having the same configuration as described in the first embodiment are labeled with like reference numerals, and the description thereof is omitted. As shown in FIG. 10, like the second embodiment, a stacked structure 7 is formed on a substrate 1 having depressions and protrusions on the surface. The configuration of this stacked structure 7 is the same as the configuration described in the first embodiment. However, as described in the second embodiment, it is understood that the configuration can be the same as that of the variation of the first embodiment.

The rest of the structure is different from that of the second embodiment, and hence is described in detail. On the stacked structure 7, an undoped GaN channel layer 20 is formed. On this GaN channel layer 20, an AlGaN electron supply layer 21 being undoped, or doped with n-type impurity, is formed. On this AlGaN electron supply layer 21, a gate electrode 22 in Schottky contact with the AlGaN electron supply layer 21 is formed. This gate electrode 22 may be formed above the AlGaN electron supply layer 21 via an insulator. Sandwiching this gate electrode on both sides, a source electrode 23 and a drain electrode 24 are formed on the AlGaN electron supply layer in ohmic contact therewith.

In this embodiment, as described above, a HEMT 200 is formed on the stacked structure 7. In the GaN channel layer 20, near the interface with the AlGaN electron supply layer 21, a two-dimensional electron gas 2DEG is formed by the piezoelectric effect of the AlGaN layer 21 and electron supply from the AlGaN electron supply layer 21. The gate electrode 23 adjusts the carrier concentration of the two-dimensional electron gas to control the electron flow flowing from the source electrode 23 to the drain electrode 24. Thus, the source-drain current is controlled.

Also in the above HEMT 200, the stacked structure 7 formed on the substrate 1 having depressions and protrusions on the surface as described in the first embodiment and the variation thereof can be used as a foundation for crystal growth. Thus, the above HEMT 200 can be operated as a high-power semiconductor device having low on-resistance and high breakdown voltage.

In the above description of the embodiments, a plurality of protrusions is are arranged on the surface of the substrate 1. Specifically, the pattern of protrusions 1a placed at respective vertices of a regular triangle is used as a unit pattern. This unit pattern is successively repeated in the surface of the substrate 1. Thus, the protrusions 1a are periodically formed in the in-plane direction on the surface of the substrate 1. In the above description, by way of example, the protrusion is formed in a cylindrical shape with the upper surface having a generally circular shape. However, the upper surface can be shaped like a polygon, such as triangle and rectangle. Furthermore, this invention is not limited to the above description. The protrusions 1a may be discretely arranged along a lattice. Alternatively, the protrusions 1a and depressions 1b may be patterned in stripes having the same width as the above embodiments.

The embodiments of the invention have been described above. However, the invention is not limited to the above embodiments, but can be variously modified without departing from the spirit of the invention. Furthermore, the embodiments can be combined with each other.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:
1. A nitride semiconductor device comprising:
a substrate having a plurality of protrusions formed in an in-plane direction on a first major surface, and a depression between adjacent ones of the protrusions;

an $Al_{x1}Ga_{1-x1}N$ ($0 \leq x1 \leq 1$) first buried layer formed on the depression and one of the protrusions of the substrate;

an $In_yAl_zGa_{1-y-z}N$ ($0<y \leq 1$, $0 \leq z \leq 1$) buried layer formed on the $Al_{x1}Ga_{1-x1}N$ first buried layer; and an $Al_{x2}Ga_{1-x2}N$ ($0 \leq x2 \leq 1$) second buried layer formed on the $In_yAl_zGa_{1-y-z}N$ buried layer, wherein a portion of the $Al_{x1}Ga_{1-x1}N$ first buried layer formed on the depression and a portion of the $Al_{x1}Ga_{1-x1}N$ first buried layer formed on the one of the protrusions are not connected to each other, and a portion of the $In_yAl_zGa_{1-y-z}N$ buried layer formed above the depression and a portion of the $In_yAl_zGa_{1-y-z}N$ buried layer formed above the one of the protrusions are connected to each other.

2. The device according to claim 1, wherein the portion of the $In_yAl_zGa_{1-y-z}N$ buried layer formed above the depression and the portion of the $In_yAl_zGa_{1-y-z}N$ buried layer formed above the one of the protrusions are connected to each other along the in-plane direction parallel to the first major surface.

3. The device according to claim 2, wherein the $In_yAl_zGa_{1-y-z}N$ buried layer is made of $In_yGa_{1-y}N$.

4. The device according to claim 2, wherein the $In_yAl_zGa_{1-y-z}N$ buried layer has a superlattice structure in which an $In_{y1}Al_{z1}Ga_{1-y1-z1}N$ ($0<y1 \leq 1$, $0 \leq z1 \leq 1$) layer and an $In_{y2}Al_{z2}Ga_{1-y2-z2}N$ ($0<y2 \leq 1$, $0 \leq z2 \leq 1$) layer are alternately stacked.

5. The device according to claim 4, wherein the $In_{y1}Al_{z1}Ga_{1-y1-z1}N$ is $In_{y1}Ga_{1-y1}N$, and the $In_{y2}Al_{z2}Ga_{1-y2-z2}N$ is $Al_{z2}Ga_{1-z2}N$.

6. The device according to claim 2, further comprising:
a first conductivity type cladding layer, an active layer, and a second conductivity type cladding layer sequentially formed on the $Al_{x2}Ga_{1-x2}N$ second buried layer.

7. The device according to claim 2, wherein the protrusions have a planar pattern in the first major surface of the substrate, the planar pattern is formed by successively and adjacently arranging a unit pattern in the first major surface, and the unit pattern is formed by placing the one of the protrusions at each of three vertices of a regular triangle.

8. The device according to claim 2, wherein the substrate is a sapphire substrate.

9. The device according to claim 1, wherein the portion of the $In_yAl_zGa_{1-y-z}N$ buried layer formed above the depression and the portion of the $In_yAl_zGa_{1-y-z}N$ buried layer formed above the one of the protrusions are not connected to each other along the in-plane direction parallel to the first major surface.

10. The device according to claim 9, wherein the portion of the $In_yAl_zGa_{1-y-z}N$ buried layer formed above the depression and the portion of the $In_yAl_zGa_{1-y-z}N$ buried layer formed above the one of the protrusions are continuous with each other by a portion of the $In_yAl_zGa_{1-y-z}N$ buried layer formed on a sidewall of the one of the protrusions and on a sidewall of the portion of the $Al_{x1}Ga_{1-x1}N$ first buried layer formed on the one of the protrusions.

11. The device according to claim 9, wherein the $In_yAl_zGa_{1-y-z}N$ buried layer is made of $In_yGa_{1-y}N$.

12. The device according to claim 9, wherein the $In_yAl_zGa_{1-y-z}N$ buried layer has a superlattice structure in which an $In_{y1}Al_{z1}Ga_{1-y1-z1}N$ ($0<y1 \leq 1$, $0 \leq z1 \leq 1$) layer and an $In_{y2}Al_{z2}Ga_{1-y2-z2}N$ ($0<y2 \leq 1$, $0 \leq z2 \leq 1$) layer are alternately stacked.

13. The device according to claim 12, wherein the $In_{y1}Al_{z1}Ga_{1-y1-z1}N$ is $In_{y1}Ga_{1-y1}N$, and the $In_{y2}Al_{z2}Ga_{1-y2-z2}N$ is $Al_{z2}Ga_{1-z2}N$.

14. The device according to claim 9, further comprising:
a first conductivity type cladding layer, an active layer, and a second conductivity type cladding layer sequentially formed on the $Al_{x2}Ga_{1-x2}N$ second buried layer.

15. The device according to claim 9, wherein the protrusions have a planar pattern in the first major surface of the substrate, the planar pattern is formed by successively and adjacently arranging a unit pattern in the first major surface, and the unit pattern is formed by placing the one of the protrusions at each of three vertices of a regular triangle.

16. The device according to claim 9, wherein the substrate is a sapphire substrate.

17. The device according to claim 1, wherein a top of the one of the protrusions of the substrate is at a higher position than a top of the portion of the $Al_{x1}Ga_{1-x1}N$ first buried layer formed on the depression.

18. The device according to claim 1, wherein a top of the one of the protrusions of the substrate is at a higher position than a top of the portion of the $In_yAl_zGa_{1-y-z}N$ buried layer formed above the depression.

19. The device according to the claim 1, wherein a top of the one of the protrusions of the substrate is at a lower position than a top of the portion of the $In_yAl_zGa_{1-y-z}N$ buried layer formed above the depression.

20. The device according to the claim 17, wherein a top of the portion $In_yAl_zGa_{1-y-z}N$ buried layer formed above the depression is at a higher position than a top of the portion of the $Al_{x1}Ga_{1-x1}N$ first buried layer formed on the one of protrusions.

* * * * *